United States Patent [19]
Johnson et al.

[11] Patent Number: 5,327,381
[45] Date of Patent: Jul. 5, 1994

[54] REDUNDANCY SELECTION APPARATUS AND METHOD FOR AN ARRAY

[75] Inventors: Larry D. Johnson, San Jose; Mark G. Johnson, Sunnyvale, both of Calif.

[73] Assignee: Mips Computer Systems, Inc., Sunnyvale, Calif.

[21] Appl. No.: 892,919

[22] Filed: Jun. 3, 1992

[51] Int. Cl.$^5$ .............................................. G11C 7/00
[52] U.S. Cl. .................... 365/200; 365/230.06; 365/225.7
[58] Field of Search ............ 365/200, 189.01, 230.06, 365/225.7; 307/445

[56] References Cited

U.S. PATENT DOCUMENTS

| | | |
|---|---|---|
| 4,587,638 | 5/1986 | Isobe et al. ............................ 365/200 |
| 4,606,013 | 8/1986 | Yoshimoto .......................... 365/200 |
| 4,613,959 | 9/1986 | Jiang . | 
| 4,714,839 | 12/1987 | Chung . |
| 4,791,319 | 12/1988 | Tagami et al. ....................... 365/200 |
| 4,791,615 | 12/1988 | Pelley, III . |
| 4,829,481 | 5/1989 | Johnson . |
| 4,839,864 | 6/1989 | Fujishima ........................... 365/200 |
| 4,849,939 | 7/1989 | Muranaka et al. ................. 365/200 |
| 4,858,192 | 8/1989 | Tatsumi . |
| 4,935,899 | 6/1990 | Morigami . |

Primary Examiner—Eugene R. LaRoche
Assistant Examiner—Vu A. Le
Attorney, Agent, or Firm—Townsend and Townsend

[57] ABSTRACT

A fused decoder for selecting one or more elements of an array, such as a row of memory, is provided. The corresponding row of memory can be permanently deselected by blowing the fuse of the decoder. Array components such as a redundant row of memory, can be substituted for the deselected component. The decoder includes a gate formed exclusively from NMOS transistors so that the decoder can provide a select signal in response to an address without an PMOS transistor responding to the address. By eliminating PMOS transistors from the gate portion of the decoder, the load presented to the address lines is reduced.

11 Claims, 2 Drawing Sheets

REDUNDANCY SELECTION APPARATUS AND METHOD FOR AN ARRAY

FIELD OF THE INVENTION

The present invention relates to disabling the output from a decoder and in particular a method and apparatus for disabling a memory array row decoder to permit substitution of a redundant memory row.

BACKGROUND OF THE INVENTION

Many electronic devices are provided in an array form, including memories which have a plurality of addressable rows. Some arrays include redundant elements. For example, a memory intended to provide 256 selectable rows may be fabricated with one or more extra or redundant rows. This is done in order that a redundant row can be substituted for a defective row, so that the array can continue to be used and replacement of the entire device can be avoided. Portions of the array, such as rows of a memory, are typically selected using a decoder coupled to each selectable row. Each decoder has the functionality of a multi-input, single-output logic gate. Conceptually, a decoder can be viewed as an AND gate which will output a "high" select signal when all of the inputs received from an address bus are simultaneously high. For those decoders that are intended to select in response to an address which does not have all inputs high, the inputs which should be low in order to select the corresponding output line can have an inverter interposed.

In one common configuration, the decoder is a CMOS NAND gate with the output of the NAND gate provided to an inverter so that the low level select output is converted to a high level select output. Of course, other configurations are also used for decoders including configurations where the output line is selected by having a low level rather than high level or where an address input is active low rather than active high. These variations, and the apparatus used to achieve them, are well known to those skilled in the art.

When decoders are used in a device having redundant elements, a circuit is used to prevent the selection of a defective row in response to the address which would normally select such a defective row. Often this element includes a fuse which can be blown to provide an open line, with the fuse being blown by, for example, a laser or the input of high-amperage current.

Previous fused decoders have been fabricated using CMOS technology, i.e., have included circuitry in which providing the select signal requires both a PMOS and an NMOS transistor to respond to each bit of the input address. An example of such a device is described in U.S. Pat. No. 4,829,481 issued May 9, 1989 to Johnson, et. al. Although this device is useful for some purposes, the CMOS circuitry presents a large load to the address lines, particularly when the address bus has many address lines, such as 20 or more address lines (i.e., 20 or more address bits are input to the decoder).

Accordingly, it would be useful to provide a fused decoder such as can be used in conjunction with disabling a decoder output to permit selection of a redundant circuit, but having a reduced load presented to the coded address lines.

SUMMARY OF THE INVENTION

The present invention provides a fused decoder apparatus which presents a reduced load to the coded address lines. The decoder includes an NMOS (rather than CMOS) gate such that the decoder provides the select signal in response to the input address, in the absence of a PMOS transistor responding to the address. Although the circuitry may include a PMOS transistor, the PMOS transistor does not respond to addresses during normal operation of the decoder and it is not necessary to have a PMOS transistor for every NMOS transistor which is used to decode the address. In one embodiment, the gate is formed using NMOS technology even though it is formed on a CMOS chip. By using an NMOS gate, the load presented to the address lines will be about one third of the load presented by a corresponding CMOS gate.

According to one embodiment of the invention, a decoder receives an address from a plurality of address lines and outputs a select signal in response to a predetermined received address. The decoder includes an NMOS gate coupled to the address lines for receiving a plurality of address bits. The NMOS gate outputs a predetermined signal when all of the received address bits are in predetermined states. A fuse connects the output for the NMOS gate to the input of an inverter. The junction of the fuse and the inverter input is connected to a device for placing a predetermined voltage on the input of the inverter when the fuse is blown. According to one embodiment, this device is a pull-up transistor. The pull-up transistor can be controlled by having a gate tied to ground voltage or by having its gate connected to a pre-charge control line.

DETAILED DESCRIPTION OF THE PREFERRED EMBODIMENTS

Figure 1:
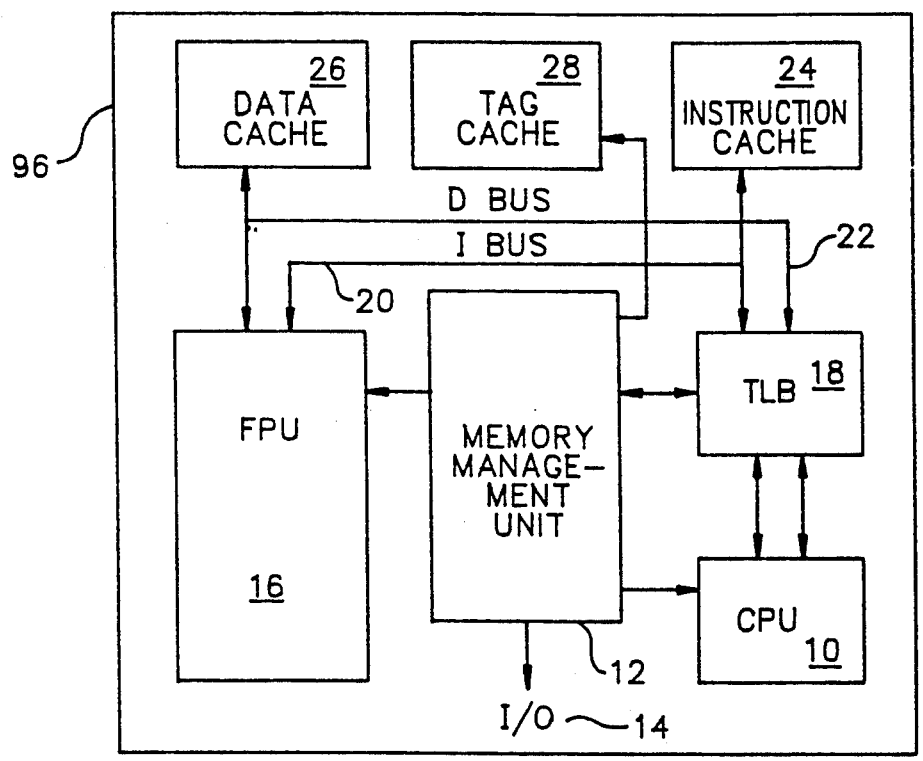
FIG. 1 is a block diagram of a microprocessor showing one potential application of the present invention.

Although the present invention can be used in connection with a number of types of memory systems, it has particular use in the context of a cache system for inclusion in a microprocessor chip 96. As depicted in FIG. 1, one embodiment of a microprocessor is built around a CPU 10 which is connected to a memory management unit 12 providing for microprocessor I/O 14 and which communicates with a floating point unit 16 (FPU) and a translation lookside buffer 18 (TLB) which also communicates directly with the CPU 10. The TLB 18 and the FPU 16 are connected by an instruction bus 20 and a data bus 22. The instruction bus 20 communicates with an instruction cache 24 and the data bus 22 communicates with the data cache 26. The memory management unit 12 communicates with a tag cache 28. The operation of all of these items are well known in the art.

The instruction cache 24, data cache 26, and tag cache 28 are specialized memory devices which have short cycle times and wide inputs and outputs. For these reasons, it is particularly important in applications such as those depicted in FIG. 1 that the memories have low per bit power consumption and small drivers to minimize RC delay and current consumption. In the instruction cache 24, data cache 26, and tag cache 28, as in others types of memory, data which is output from the memory cells on bit lines must be evaluated and output. This is typically done by a sense amplifier. The data to be output is selected by placing a predetermined signal, (e.g., a logical "high" signal) on one of a plurality of input lines. The memory input lines are controlled by a decoder which selects one of the input lines, (i.e., places a logical "high" value on the input line) in response to a predetermined address appearing on an address bus.

Figure 2:
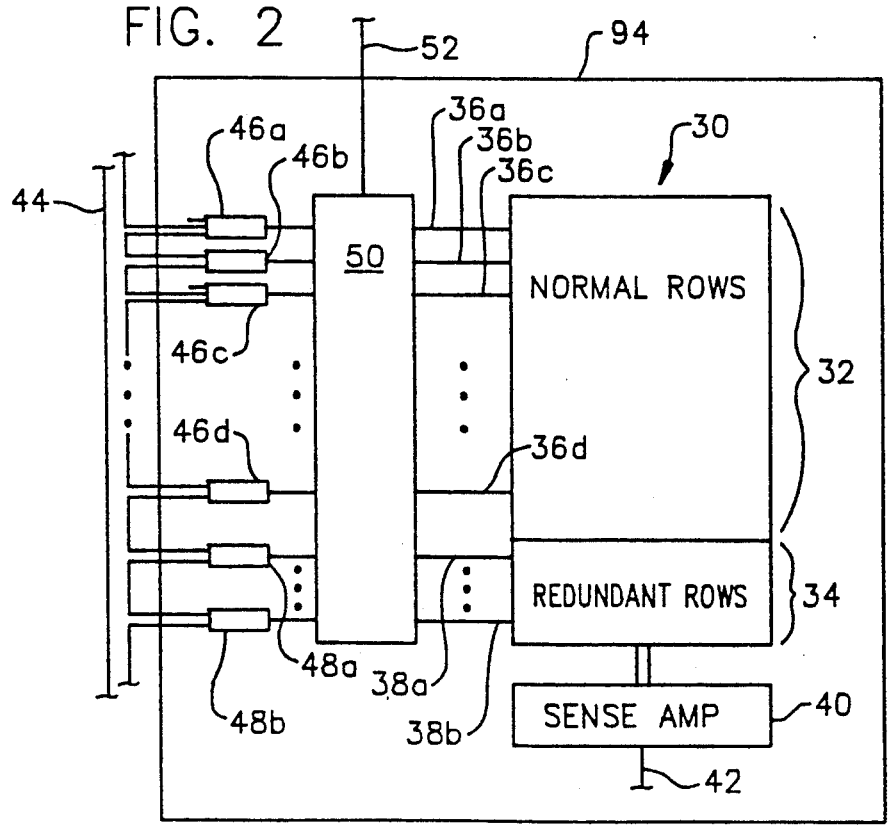
FIG. 2 is a block diagram showing the connection of a plurality of row decoders to a memory device.

As seen in FIG. 2, a memory 30 includes a plurality of normal rows 32 and one more redundant rows 34. The rows, 32, 34 are selected by placing a predetermined signal, such as a logical "high" signal on the corresponding input line 36a–d, 38a, 38b. Data from the selected row is evaluated by a sense amp 40 and output on an output line 42. Although the present invention can be used in connection with a number of different types of memories, according to one embodiment of the invention, the memory 30 is a CMOS memory having 256 normal rows 32 and two redundant rows 34. Addresses for accessing memory travel on an address bus 44. Although a number of configurations are possible, in one embodiment, the address bus 44 is at least 20 bits wide. The address bus 44 is connected to a number of decoders 46a–d, corresponding to the row input lines 36a–d of the memory 30. As described above, each decoder 46a–d is configured to select one of the normal rows 32 in response to a predetermined address appearing on the address bus 44. Additional decoders 48a, 48b are provided for selecting one of the redundant rows 34 after access to a defective normal row has been disabled as described below. The substitution of a redundant row for a permanently deselected defective row 32 is achieved by a substitution circuit 50 which may be programmed or controlled by an input line 52. One circuit which can be used for substituting a redundant element for a defective element is described in commonly assigned U.S. application Ser. No. 07/893,156. Other circuits are described in Kokkenen, et. al. "Redundancy Techniques for Fat Static Rams," *Digest of Technical Papers*, IEEE 1981 International Solid State Circuits Conference, pp. 80–81, and Smith, et. al., "FAM 18.3" ISSCC 1982, pp. 252–253 all of which are incorporated herein by reference to the extent needed for understanding the present invention.

Figure 3:
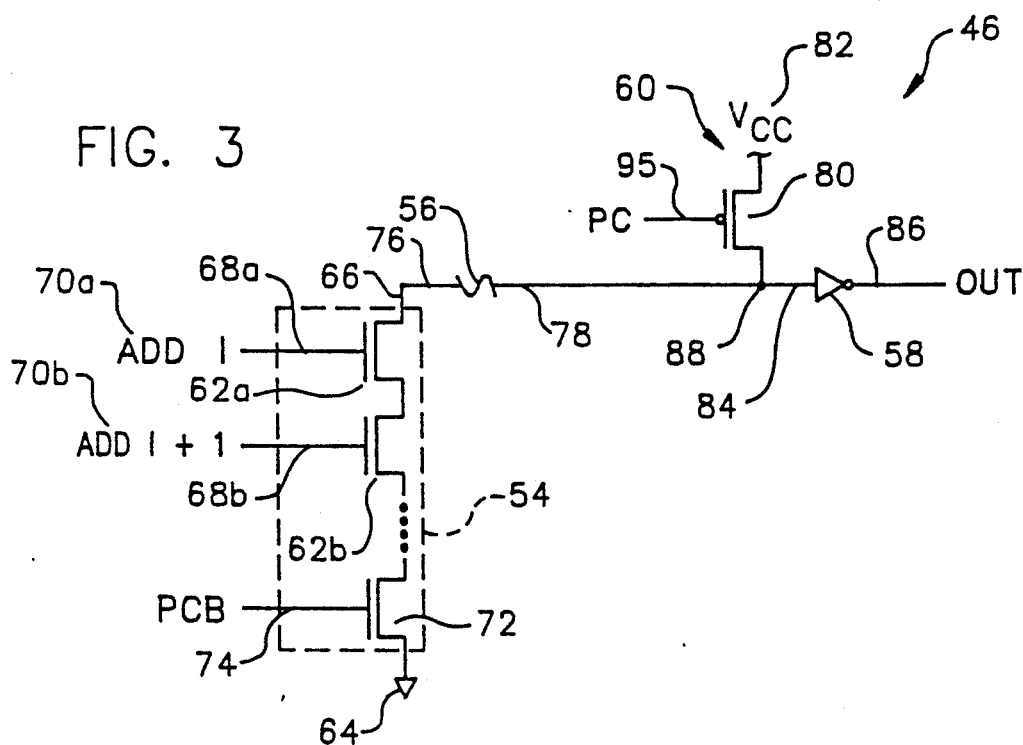
FIG. 3 is a schematic diagram of a row decoder according to one embodiment of the present invention.

FIG. 3 depicts a decoder 46 according to one embodiment of the present invention. The decoder includes an NMOS gate 54, a fuse 56, an inverter 58, and a circuit device 60 for providing a predetermined voltage to the input of the inverter 58 upon blowing of the fuse 56. The NMOS gate 54 includes a plurality of N-channel transistors 62a, 62b having their drain-source paths connected in series between ground 64 and a gate terminal 66. The gate electrodes 68a, 68b of the N-channel transistors 62a, 62b form input terminals of the gate 54 and are connected, respectfully, to the individual address lines 70a, 70b of the address bus 44. Although only two transistors 62a, 62b are shown connected to two address lines 70a, 70b, as noted above, in one embodiment the address bus is 20 bits wide and, in this embodiment, the gate 54 will include 20 N-channel transistors 68 each having its gate coupled to one of the 20 address input lines 70. Additionally, a transistor 72 can be placed with its source-drain path series connected between the ground 64 and the transistors 68 and controlled by a pre-charge (PCB) line 74 for the purpose of isolating node 68 from ground during the time the address lines are changing. The inverter 58 has its input 84 connected to the second terminal of the fuse 78 and provides an output over an output line 86 which acts as the row select signal during normal operation.

The fuse element at 56 has a first terminal 76 connected to the gate terminal 66 and also has a second terminal 78.

In the embodiment depicted in FIG. 3, the device 60 for providing a predetermined voltage is a P-channel transistor 80 having its source-drain path connected between a point of high voltage, such as VCC voltage 82 and the second terminal 78 of the fuse. In the embodiment of FIG. 3, the gate of the P-channel transistor 80 is connected to a pre-charge control line 95 for a purpose described below.

The signal on the output line 86 is thus determined by the status (logical "high" or logical "low" of voltage at a node 88 which is the junction of the inverter input 84, the predetermined voltage device 60 and the fuse line 78. In normal operation, when at least one of the signals on the input lines 68 is a logical "low", there will be no conductive pathway from the node 88 to ground 64. As is well known for pre-charged circuits, at a predetermined time before memory output is to be evaluated, the pre-charge (PC) control line 95 causes the transistor 80 to become conductive. When there is no pathway from VCC 82 to ground 64, the voltage at node 88 will be held at VCC representing a logical "high" and thus the inverted signal 86 will the held at a logical "low" level, as desired. However, when all of the inputs 68a, 68b to the gate 54 are at a logical "high" level, and the PCB signal 74 is at a logical high level, there will be a conductive pathway from the node 88 to ground 64. In one embodiment, when the pre-charge signal 95 causes transistor 80 to provide a conductive pathway between the VCC source 82 and node 88, the VCC voltage at node 88 will be dissipated to ground 64 via gate 54. Accordingly, the voltage level at node 88 will be a logical "low" and the inverted signal 86 will be a logical "high", causing the corresponding row to be selected, as desired. After evaluation of the memory, the pre-charge line 95 is returned to its logical "high" state so as to render the transistor 80 substantially non-conducting.

Thus, in normal operating mode, the decoder 46 responds to input of an address on the address line 70 and outputs a signal 86 in response to the input of the address signal 70. The response to the address signals does not involve a PMOS device. Although the circuitry shown in FIG. 3 includes a PMOS device 80, the PMOS device 80 does not respond to address bit 70a, 70b. The PMOS device 80 responds only to a pre-charge control signal 95. The operation of the PMOS device 80 is the same regardless of what signals are placed on the address line 70a, 70b. In contrast, the NMOS gates 54 respond to the address bits 70a, 70b since the output 66 from the gate 54 changes depending on the addresses of 70a, 70b. The load presented to the address lines 70a, 70b is the load provided by the NMOS transistors 62a, 62b. This is in contrast to a CMOS configuration in which, typically, the address lines 70a, 70b would be provided not only to the gates of NMOS devices, but would also be provided to the gates of PMOS devices. The load presented to the address lines in a device using CMOS technology is about 3 times the load provided by the embodiment depicted in FIG. 3.

When it is desired to permanently disable the corresponding row, such as when the row has been discovered to be defective, the fuse 56 is blown, such as by a laser beam or a high-amperage current, as is well-known in the art. When the fuse 56 is blown, the path from node 88 to ground 64 is permanently destroyed. Accordingly, whenever transistor 80 is in a conductive state, node 88 will be held at a logical "high" level and, the output 86 will be held at a logical "low" level.

By placing the predetermined voltage device 60 after the fuse 56 (i.e., between the fuse 56 and the inverter 58) rather than before the fuse (i.e., between the gate 54 and the fuse 56), the predetermined voltage device 60 performs two functions (i.e., performs a normal operation function and a blown-fuse function), thus avoiding the need for providing a separate voltage source for use in the event of a blown fuse.

Figure 4:
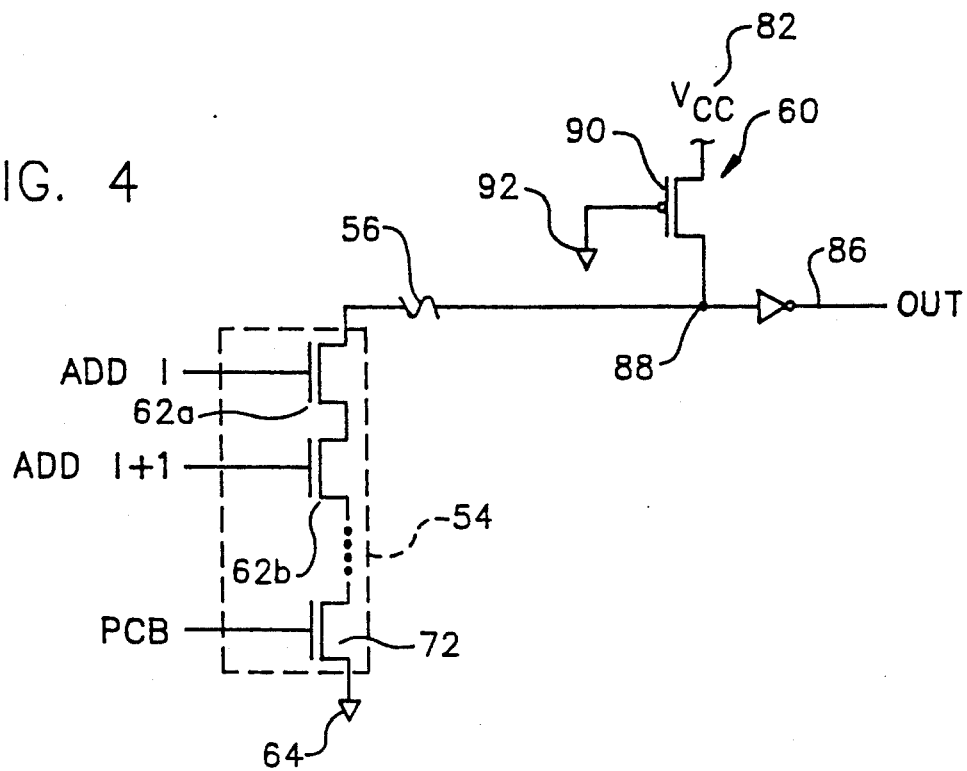
FIG. 4 is a schematic diagram showing a row decoder according to another embodiment of the present invention.

FIG. 4 depicts another embodiment of the present invention. The embodiment of FIG. 4 is similar to the embodiment of FIG. 3, except that the gate 90 of the predetermined voltage device 60, rather than being controlled by a pre-charge control line, is tied to ground potential 92. In this way, the VCC voltage 82 is constantly supplied to node 88. Node 88 thus will be at a logical "high" level if one or more of the transistors 62a, 62b of the gate 54 is non-conducting (e.g., because one or more of the gate input lines is in a logical "low" state) or if the fuse 56 has been blown, resulting in a logical "low" output signal 86. When the fuse 56 is intact and all transistors 68a, 68b, 72 of the gate 54 are conductive, the VCC voltage provided to node 88 will be dissipated to ground 64 causing a logical "high" signal on the output line 86.

In light of the above description, a number of advantages of the present invention can be seen. The present invention permits an address supplied to a memory to be decoded for selecting portions of the memory while presenting a low load to the address bus 44. According to the present invention, it is possible to provide a load consistent with NMOS technology even when the circuitry on the memory chip 94 or the memory portion of the chip 96 is, in general, CMOS circuitry. The present invention permits deselection of a defective row of memory by blowing a single fuse. The present invention also permits substitution of a redundant row of memory for a deselected, defective row. According to one embodiment of the invention, current consumption is reduced by providing a predetermined voltage device controlled by a pre-charge line so that it is not necessary to continually draw current through the predetermined voltage device, but only to draw current during a pre-charge period.

A number of variations and modifications of the present invention can also be used. Although the present invention is particularly useful in connection with a decoder which receives a large number of address bits, such as 20 bits, can also be used with more or fewer address bits. The present invention can be used in connection with a chip fabricated by methods other than CMOS technology. The present invention can be used in connection with memories other than cache memory and can be used in connection with array devices other than memories which have components selected by decoders.

Although the present invention has been described by way of a preferred embodiment and certain variations and modifications, other variations and modifications can also be used, the invention being defined by the following claims.

What is claimed is:

1. A fused decoder apparatus for receiving an address comprising a plurality of address bits from a plurality of address lines and outputting a select signal in response to a predetermined received address to select among a plurality of address rows, the apparatus comprising:
    an NMOS gate coupled to said address lines to receive said plurality of address bits and having an output terminal to output a predetermined signal when all of said received address bits are in a predetermined state;
    an inverter having an input and an output, the input coupled to receive the output from said NMOS gate and provide said select signal in response;
    a fuse connecting said output terminal of said NMOS gate to said inverter;
    exactly one PMOS transistor coupled between the output terminal of said NMOS gate and the input of said inverter, said PMOS transistor having a gate terminal coupled to a preload signal line, wherein said PMOS transistor, when placed in a conductive state, provides a conductive pathway between a source voltage and said NMOS gate when said fuse is not blown and said PMOS transistor, when placed in a conductive state, provides a high level input to said inverter, when said fuse is blown wherein said PMOS transistor is placed in said conductive state by said preload signal; and
    wherein said decoder provides said select signal in response to said address and wherein all transistors in said decoder which respond to said address are NMOS transistors.

2. Apparatus, as claimed in claim 1, wherein said decoder is formed on a CMOS chip.

3. Apparatus, as claimed in claim 1, wherein said decoder is a circuit for use in a semiconductive memory comprising an array of storage elements arranged in rows and columns, and wherein said select signal is a signal for selecting one of said rows or one of said columns.

4. Apparatus, as claimed in claim 2, further comprising a decoder connected to each of said plurality of rows.

5. Apparatus as claimed in claim 3 wherein said memory includes at least 256 rows.

6. Apparatus as claimed in claim 2 wherein said memory further includes at least one selectable redundant row and further comprising means for selecting said redundant row after said fuse has been blown.

7. Apparatus, as claimed in claim 1, wherein said NMOS gate is a NAND gate.

8. Apparatus, as in claimed in claim 1, wherein said plurality of address lines includes at least twenty address lines.

9. In a CMOS semiconductive memory comprising an array of storage elements arranged in rows and columns and having at least one redundant row, apparatus comprising:
    a plurality of row decoder circuits, each row decoder circuit having an output connected to one of said rows of said memory, each row decoder circuit including:
        a NAND gate having at least twenty input terminals connected to address lines and having an output terminal, the NAND gate comprising a plurality of N-channel transistors having their drain-source paths connected in series between ground and a NAND gate output terminal, the gate electrode of each N-channel transistor being connected to one of said input terminals;

a fuse element configured to be selectively blown, having a first terminal connected to aid NAND gate output terminal and having a second terminal;

exactly one pull-up P-channel transistor having its source-drain path connected between a point of high voltage and said second terminal of said fuse, and having its gate connected to a precharge control line;

an inverter having its input connected to said second terminal of said fuse, and providing a row selected signal at its output;

wherein said decoder provides said selected signal in response to said address and wherein all transistors in said decoder which respond to said address are NMOS transistors;

means for selecting said redundant row after a fuse in one of said decoders has been blown;

exactly one PMOS transistor coupled between the output terminal of said NMOS gate and the input of said inverter, wherein said PMOS transistor, when placed in a conductive state, provides a conductive pathway between said high voltage and said NMOS gate when said fuse is not blown and said PMOS transistor, when placed in a conductive state, provides a high level input to said inverter, when said fuse is blown.

10. In a CMOS semiconductive memory comprising an array of storage elements arranged in rows and columns and having at least one redundant row, a method for disabling one of said rows comprising:

providing a plurality of row decoder circuits, each row decoder circuit having an output connected to one of said rows of said memory, each row decoder circuit including an NMOS gate coupled to a plurality of address lines to receive an address and output a predetermined signal when the bits of said received address bits are in predetermined states;

an inverter having an input and an output, the input coupled to receive the output from said NMOS gate and provide a row select signal in response;

a fuse connecting said output from said NMOS gate to said inverter;

first means for placing a predetermined voltage on the input of said inverter when said fuse is blown, said first means comprising exactly one PMOS transistor coupled between the output terminal of said NMOS gate and the input of said inverter, said PMOS transistor having a gate terminal coupled to a preload signal line, wherein said PMOS transistor, when placed in a conductive state, provides a conductive pathway between a source voltage and said NMOS gate when said fuse is not blown and said PMOS transistor, when placed in a conductive state, provides a high level input to said inverter, when said fuse is blown, wherein said PMOS transistor is placed in said conductive state by said preload signal;

receiving a first address on said plurality of address lines;

using said decoder to provide a select signal in response to said first address wherein all transistors in said decoder which respond to said address are NMOS transistors; and blowing said fuse to prevent the output of said select signal in response to said first address.

11. A method, as claimed in claim 10, wherein said memory further includes at least one selectable redundant row and further comprising:

selecting said redundant row after said fuse has been blown.

* * * * *